United States Patent
Chou et al.

(10) Patent No.: US 10,157,906 B2
(45) Date of Patent: Dec. 18, 2018

(54) SYSTEMS AND METHODS FOR PROTECTING A SEMICONDUCTOR DEVICE

(71) Applicant: Taiwan Semiconductor Manufacturing Company Limited, Hsinchu (TW)

(72) Inventors: Kuo-Yu Chou, Hsinchu (TW); Shang-Fu Yeh, Hsinchu (TW); Yi-Ping Chao, Hsinchu County (TW); Chih-Lin Lee, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/226,995

(22) Filed: Aug. 3, 2016

(65) Prior Publication Data

US 2018/0040606 A1  Feb. 8, 2018

(51) Int. Cl.
*H01L 27/02*  (2006.01)

(52) U.S. Cl.
CPC ...... *H01L 27/0274* (2013.01); *H01L 27/0251* (2013.01); *H01L 27/0288* (2013.01)

(58) Field of Classification Search
CPC ............. H01L 27/11558; H01L 27/115; H01L 29/7881; H01L 21/28273; H01L 29/42328
USPC .............. 257/E27.103, E29.3, 315, E21.409, 257/E29.309; 438/261
See application file for complete search history.

(56) References Cited

U.S. PATENT DOCUMENTS

| 6,972,457 | B1 * | 12/2005 | Hopper .................. H01L 27/115 257/314 |
| 2002/0048190 | A1 * | 4/2002 | King ..................... B82Y 10/00 365/185.18 |
| 2009/0309153 | A1 * | 12/2009 | Yanagi .............. H01L 27/11568 257/324 |
| 2014/0151780 | A1 * | 6/2014 | Park .................. H01L 27/11519 257/316 |
| 2015/0213180 | A1 * | 7/2015 | Herberholz ............. H01L 23/00 716/119 |

* cited by examiner

*Primary Examiner* — Jonathan Han
(74) *Attorney, Agent, or Firm* — Jones Day

(57) ABSTRACT

Circuits and methods for protecting a device are provided. A first device to be protected includes a gate dielectric of a first thickness. A second device includes a gate dielectric of a second thickness that is less than the first thickness. A gate is shared by the first device and the second device.

20 Claims, 5 Drawing Sheets

SYSTEMS AND METHODS FOR PROTECTING A SEMICONDUCTOR DEVICE

BACKGROUND

Integrated circuits and other semiconductor devices are formed to include a multitude of individual transistors coupled together and to various other features to form functional devices. If any one of the transistors fails, device functionality can be destroyed. In advanced semiconductor device fabrication and manufacturing, plasma chemistry operations are used multiple times in the sequence of fabrication operations used to form integrated circuit and other semiconductor devices. Plasma operations include plasma etching operations and plasma deposition operations. Plasma vapor deposition, PVD, and plasma enhanced chemical vapor deposition, PECVD, represent just two of many plasma deposition operations.

The plasma operations utilize excited ions, and these ions are directed to a surface of a substrate on which a device is formed, often at high biases. The highly sensitive transistors utilized in integrated circuits and other semiconductor devices commonly include gates (e.g., gates including polysilicon or metal) positioned over a gate dielectric which may be an oxide or other gate dielectric material. During plasma operation, charge accumulates on the gates, and the accumulated charge results in an increased voltage across the gate dielectric. If the voltage across the gate dielectric exceeds a threshold (e.g., 10 MV/cm), charge passage through the dielectric can cause damage that create traps in an interface between the dielectric and an underlying substrate (e.g., a silicon substrate). Plasma induced gate dielectric damage is commonly referred to as the antenna effect and is an effect that damages transistor gates and the transistor gate dielectric materials. Such damage can potentially cause yield, reliability, and noise problems during the manufacture of MOS integrated circuits. Device functionality can be destroyed if the gate dielectric damage is severe.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
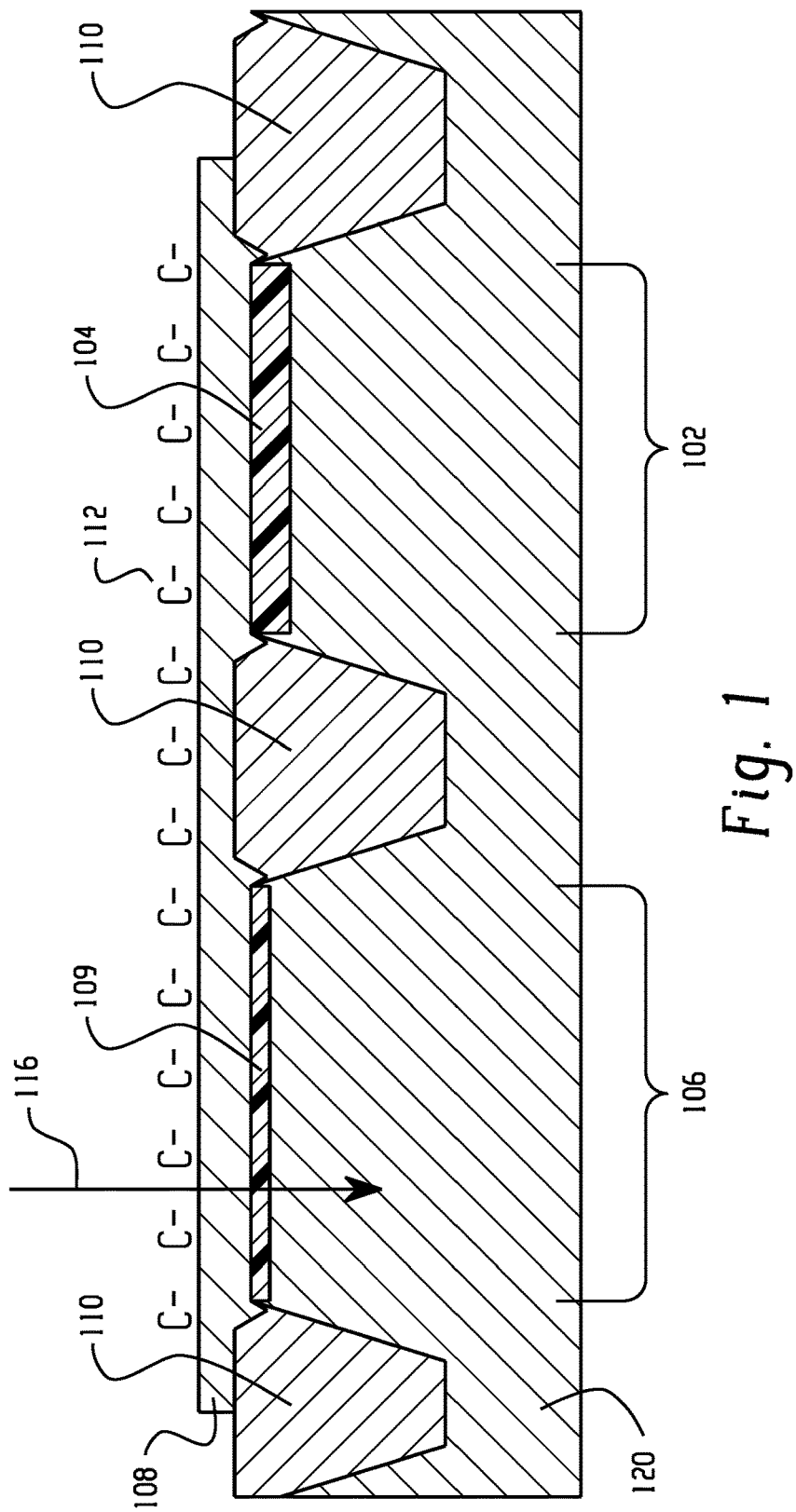
FIG. 1 depicts an example circuit for protecting a critical device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The manufacture of large scale integrated circuits in a mass production facility involves hundreds of discrete processing steps beginning with the introduction of blank semiconductor wafers at one end and recovering the completed chips at the other. The manufacturing process includes a segment where semiconductor devices are formed within a semiconductor wafer and a segment which includes the formation of the various layers of interconnection metallurgy above a surface of the semiconductor wafer. Most of these processing steps involve depositing layers of material, patterning them by photolithographic techniques, and etching away the unwanted portions. The materials primarily include insulators and metal alloys. In some instances the patterned layers serve as temporary protective masks. In others they are the functional components of the integrated circuit chip.

Radio-frequency (RF) plasmas may be used extensively in many of these processing steps. Reactive-ion-etching (RIE) provides the etching anisotropy required to achieve a high degree of pattern definition and precise dimensional control. Here the gaseous chemical etching is assisted by unidirectional ion bombardment provided by an RF plasma. Photoresist layers, too, are frequently removed, not by chemical solvents, but more cleanly by plasma ashing.

A metal-oxide-silicon-field-effect-transistor (MOSFET) is a device consisting of two shallow regions of one type semiconductor—the source and the drain—separated by a region of another type. The conductivity of the central region (channel) is modulated by applying a voltage to an electrode (gate) which overlies the channel region and is separated from it by a thin insulating layer (i.e., gate dielectric comprising an oxide). CMOS (complementary MOS) technology utilizes MOSFETs in pairs, one an n-type channel device (NMOS) and the other a p-type channel device (PMOS). The simple nature of these devices and their minimal heat dissipation permits an extraordinary degree of miniaturization and consequently a high density of circuits.

The gate dielectric which overlies the channel region includes a thermally grown silicon oxide, in some embodiments. The insulating film is highly susceptible to damage from external sources (e.g., high electric fields, etc.) during manufacture. A prominent cause of such damage is ion and electron bombardment from plasmas used while forming the various layers. The surfaces of patterned semiconductor wafers located within a plasma reactor present multiple areas of conductors and insulators to the plasma. These produce local non-uniformities in the plasma currents which result in charge build-up on the electrically floating conductor surfaces.

After the gate dielectric is formed, it is covered with a layer of conductive material (e.g., polysilicon, metal, etc.) within which the gate electrode is defined. The etching of this conductive layer may be accomplished by reactive-ion-etching, providing the first in a series of exposures of the gate dielectric to an RF plasma. In this instance, the area of the gate electrode is covered with photoresist. As etching proceeds, the exposed conductive material provides sufficient conduction to prevent local charge build-up. However, as the endpoint is approached, the conductive layer breaks up and residual, now isolated, regions of conductive material surrounding the photoresist protected gate electrode act as an antenna which accumulate positive charge. This results in the development of a positive potential sufficiently high to cause current flow through the gate dielectric. These conductive material halos can present a high antenna-to-thin dielectric area ratio causing massive current flow in the gate dielectric. As etching proceeds, the halos of conductive material disappear and the antenna area is reduced to the thin edges of the gate electrode itself.

The mechanism of current flow though the gate dielectric is primarily Fowler-Nordheim (FN) tunneling. FN tunneling occurs at fields in excess of 10 MV/cm. Charge build up on the gate electrode resulting in a gate electrode potential of only 10 volts is therefore sufficient to induce FN tunneling through a dielectric layer of 100 Angstroms. Such potentials are easily achieved in conventional plasma reactors. Excessive FN tunneling currents eventually lead to interface traps in the gate dielectric. Such trap sites can cause random telegraph signal (RTS) noise and/or flicker noise in devices, both of which are undesirable.

A consequence of these numerous exposures of semiconductor wafers to RF plasmas and other forms of ionic radiation is the potential occurrence of radiation damage and the accumulation of charge on exposed conductive components which leads to damaging current flows and trapped charge affecting the semiconductor devices. Thus, plasma induced damage is a well-known issue during the semiconductor wafer manufacturing process. Sometimes referred to as the "antenna effect" or "plasma induced gate dielectric damage," plasma induced damage refers to the charge accumulation in isolated nodes during the processing of an integrated circuit. Such damage may affect the reliability and performance of the integrated circuit device. Plasma induced damage can occur at various points in the processing flow. For example, plasma induced damage can occur during etching of a gate (e.g., a gate comprising polysilicon or metal, as described above), during etching of material (e.g., metal) to form contacts and vias, and during plasma ashing processes used to remove photoresist.

The approaches of the instant disclosure provide systems and methods for protecting an integrated circuit device from plasma induced gate dielectric damage (e.g., that occurs during the processing of the device). In embodiments described herein, both a "critical device" and a "dummy device" are fabricated. As referred to herein, a "critical device" is a device (e.g., a MOSFET-based, integrated circuit device) that is to be protected from damage (e.g., plasma induced gate dielectric damage that occurs during processing of the critical device). As referred to herein, a "dummy device" is a device that is used for the purpose of protecting the critical device from damage. The critical device and the dummy device share a common gate (e.g., a gate comprising polysilicon or metal, etc.). During the processing of the devices, when charge accumulates on the gate, the dummy device presents a lower barrier to the discharging of the accumulated charges, in comparison to the critical device. Consequently, carrier tunneling (e.g., FN tunneling) occurs in the dummy device, but does not occur in the critical device. The non-critical dummy device thus experiences plasma induced gate dielectric damage but the critical device is protected from any such damage. The approaches of the instant disclosure are implemented in several embodiments described below.

FIG. 1 depicts an example circuit for protecting a critical device 102, in accordance with some embodiments. The example circuit includes the critical device 102 and a dummy device 106, which are formed on a common substrate 120. Shallow trench isolation (STI) insulator material 110 is disposed between the critical device 102 and the dummy device 106 and electrically isolates portions of the devices 102, 106 from one another. In the embodiment of FIG. 1, the critical device 102 has a gate dielectric 104 of a first thickness, and the dummy device 106 has a gate dielectric 109 of a second thickness that is less the first thickness. The respective gate dielectrics 104, 109 comprise oxide materials (e.g., silicon dioxide, silicon oxide, etc.), in some embodiments. In an example, the gate dielectric 104 of the critical device 102 has a thickness within an approximate range of 30-100 angstroms, and the gate dielectric 109 of the dummy device 106 has a thickness within an approximate range of 5-60 angstroms. It is noted that these thicknesses are only examples, and that in other embodiments, the gate dielectrics 104, 109 have other thicknesses.

The critical device 102 and the dummy device 106 share a common gate 108. The gate 108 comprises a conductive material, and in embodiments, the gate 108 comprises polysilicon or metal. As shown in FIG. 1, the gate 108 is formed over the gate dielectrics 104, 109 of the respective critical device 102 and dummy device 106. The gate 108 is also formed on the STI insulator material 110 that separates the critical device 102 from the dummy device 106. During processing (e.g., processing that utilizes an RF plasma or another form of ionic radiation, such as RIE etching, etc.) of the critical device 102, charge accumulates on the gate 108, thus resulting in a voltage on the gate 108. With the gate 108 being shared by the critical device 102 and the dummy device 106, a voltage drop over the critical device 102 is the same as that over the dummy device 106. In the embodiment of FIG. 1, a voltage drop between the gate 108 and the substrate 120 is the same for both the critical device 102 and the dummy device 106.

Although there is a same voltage drop over the critical device 102 and the dummy device 106, an electric field present in the gate dielectric 109 of the dummy device 106 is greater than an electric field present in the gate dielectric 104 of the critical device 102. The higher electric field in the gate dielectric 109 is a consequence of the gate dielectric 109 being thinner than the gate dielectric 104. During the processing of the devices 102, 106, when charge 112 accumulates on the gate 108, carrier tunneling 116 (e.g., FN tunneling, etc.) occurs in the dummy device 106 as a result of the higher electric field in the gate dielectric 109. Conversely, carrier tunneling does not occur in the critical device 102, due to the lower electric field in the gate dielectric 104.

The dummy device 106 thus presents a lower barrier to the discharging of the accumulated charges 112, in comparison to the critical device 102. The dummy device 106 experiences plasma induced gate dielectric damage but the critical device 102 is protected from any such damage. Consequently, the critical device is free of the above-described RTS.

The approaches of the instant disclosure differ from conventional approaches. One conventional approach is termed "design rule check" (DRC). Under the conventional DRC approach, various steps are taken to lower plasma induced gate dielectric damage (e.g., changes to metal routing, adding embedded protection diodes, etc.). However, as described above, plasma induced damage commonly occurs during gate etching (e.g., etching polysilicon, metal, etc.) and contact etching (e.g., before a M1 metal layer process), and the DRC approach cannot reduce or eliminate plasma induced damage that occurs during these processes. Another conventional approach is termed "process improvement." Under the conventional process improvement approach, a process recipe may be changed to reduce plasma induced damage, and processes may be added to repair defects in the gate dielectric. However, this approach can only reduce plasma induced damage, and it cannot eliminate all plasma induced damage. Another conventional approach relies on modifying an architecture of the device that is to be protected from plasma induced damage. For example, in some approaches, one or more dimensions of the device to be protected are enlarged in order to reduce plasma induced damage in the device. In these approaches, plasma induced damage is reduced or eliminated at the cost of a larger device size. These conventional approaches and others have various other deficiencies (e.g., process-based approaches may present bottlenecks in the processing flow, device-based approaches may have relatively high leakage current, etc.).

In contrast to these conventional approaches, the approaches of the instant disclosure utilize a "circuit-based" solution that utilizes both a critical device and a dummy device, as described above. In contrast to one or more of the conventional approaches described above, the circuit-based solution eliminates plasma induced damage that occurs during gate etching (e.g., etching conductive material for forming a gate) and contact etching (e.g., before a M1 metal layer process). Further, the circuit-based solution may allow for all plasma induced damage to be eliminated, in contrast to one or more of the conventional approaches that only minimize the damage without totally eliminating it. Additionally, in contrast to one or more of the conventional approaches described above, the circuit-based solution of the instant disclosure does not require modification of the architecture of the critical device to be protected. Rather, the extra dummy device is added to protect the critical device, and the architecture of the critical device is unchanged. The circuit-based approach of the instant application is so termed because it relies on the formation of a "circuit" including the critical device and the dummy device.

Figure 2A:
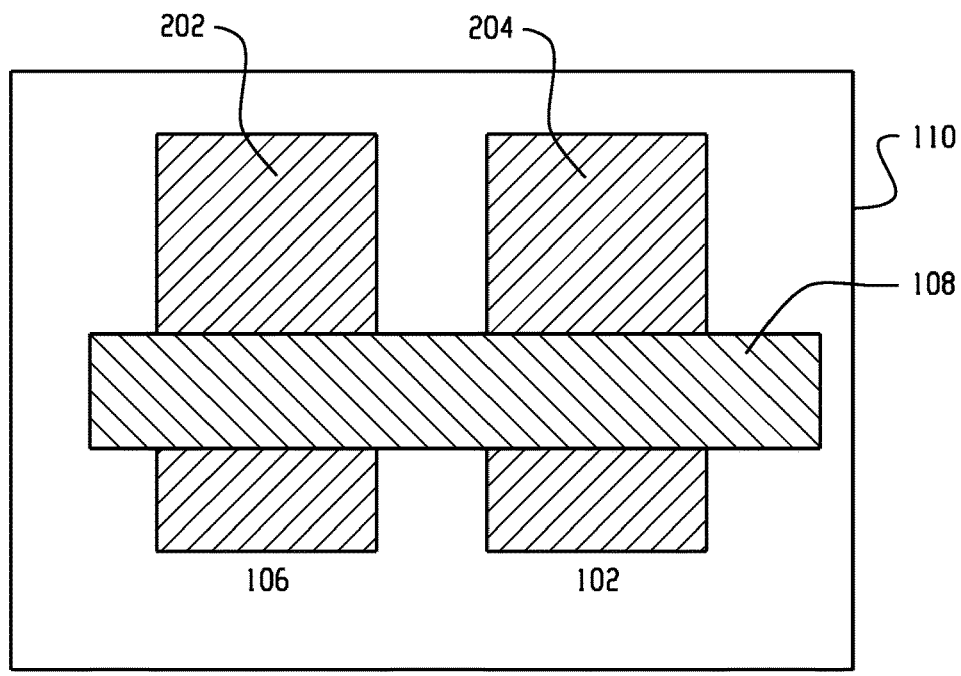
FIG. 2A depicts an example layout of a circuit for protecting a critical device, in accordance with some embodiments.

FIG. 2A depicts an example layout of a circuit for protecting the critical device 102, in accordance with some embodiments. The layout of FIG. 2A includes the critical device 102 formed in a first portion of semiconductor material 204 (e.g., a first semiconductor region 204) and the dummy device 106 formed in a second portion of semiconductor material 202 (e.g., a second semiconductor region 202). In embodiments, each of the semiconductor regions 202, 204 comprises an active device region (e.g., a transistor device area comprising source, drain, and channel regions of a transistor device, etc.) including one or more semiconductor structures (e.g., transistor structures, etc.) formed therein. The semiconductor regions 202, 204 may be referred to as oxide definition (OD) regions. The semiconductor regions 202, 204 are spatially separated by the STI insulator material 110 that is disposed between the semiconductor regions 202, 204, and the STI insulator material 110 provides electrical isolation between the semiconductor structures formed in the respective semiconductor regions 202, 204. In embodiments, the STI insulator material 110 surrounds all sides of the semiconductor regions 202, 204, as depicted in FIG. 2A.

The single gate 108 is shared by the critical device 102 and the dummy device 106, and during processing (e.g., processing that utilizes an RF plasma or another form of ionic radiation, such as RIE etching, etc.) of the devices 102, 106, charge accumulates on the gate 108, thus resulting in a voltage on the gate 108. With the gate 108 being shared by the critical device 102 and the dummy device 106, a voltage drop over the critical device 102 is the same as that over the dummy device 106. The critical device 102 has the thicker gate dielectric 104, and the dummy device 106 has the thinner gate dielectric 109. Such gate dielectrics 104, 109 are not visible in FIG. 2A but are depicted in FIG. 1, described above. As a result of the difference of the gate dielectric thicknesses, when charges accumulate on the gate 108 during processing, carrier tunneling occurs in the dummy device 106 before the critical device 102. Accordingly, any plasma induced damage occurs in the dummy device 106, and the critical device 102 is protected from such damage.

Figure 2B:
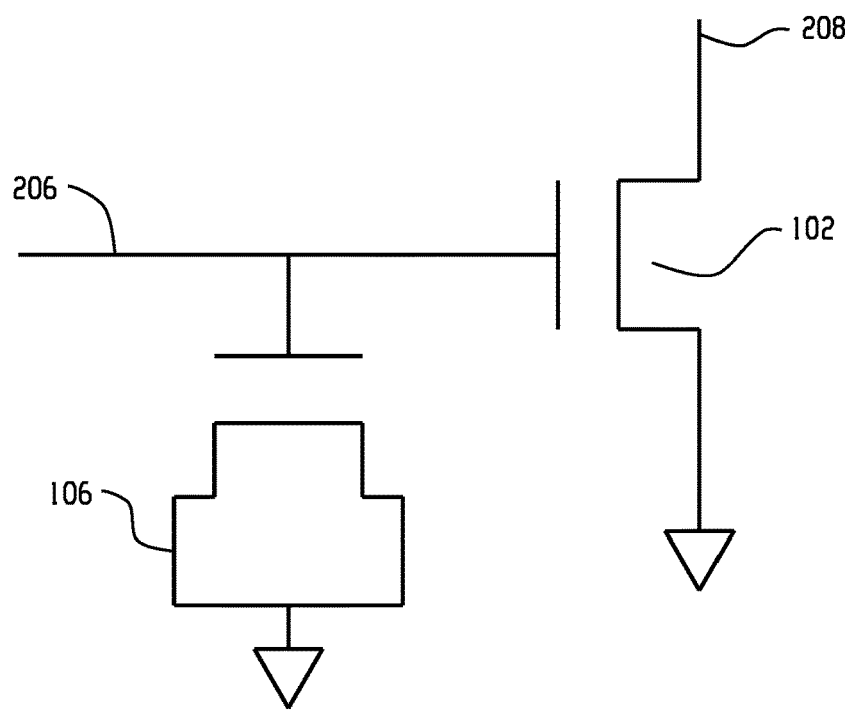
FIG. 2B depicts an example equivalent circuit for the circuit of FIG. 2A, in accordance with some embodiments.

FIG. 2B depicts an example equivalent circuit for the circuit of FIG. 2A, in accordance with some embodiments. As shown in the equivalent circuit, the gates of the critical device 102 and the dummy device 106 are tied together (e.g., via the common gate 108, described above). In examples, the critical device 102 is a column bias device (e.g., in a CMOS image sensor) that receives a column bias 208, as shown in FIG. 2B. Such column bias devices are examples of devices that are sensitive to RTS and that should be protected from plasma induced damage in order to minimize or eliminate RTS. Using the systems and methods of the instant application, such critical devices are protected from plasma induced damage via the use of the dummy devices.

Figure 3A:
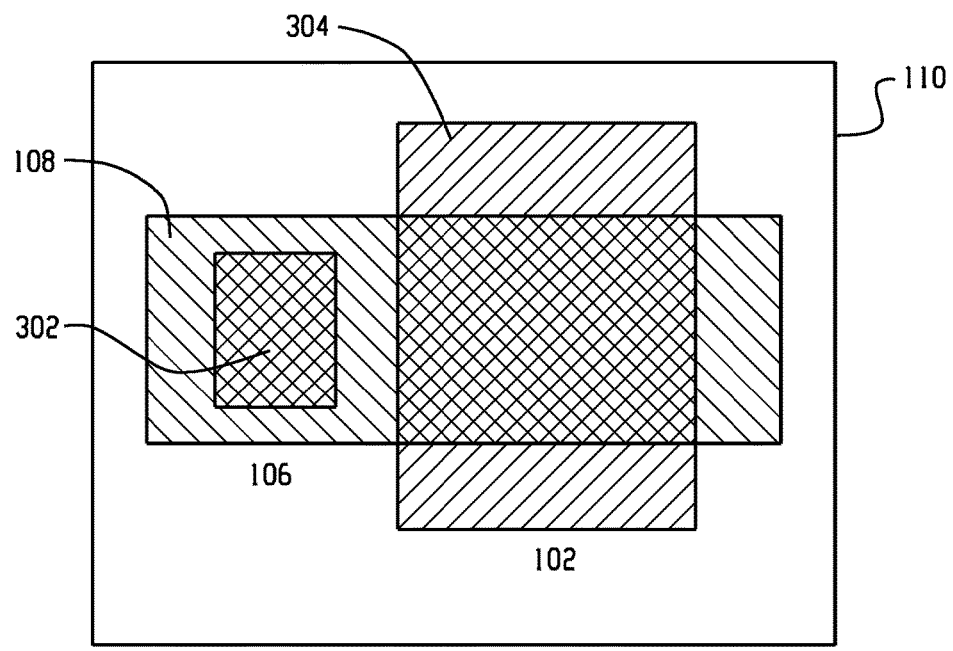
FIG. 3A depicts an example layout of another circuit for protecting a critical device, in accordance with some embodiments.

FIG. 3A depicts an example layout of another circuit for protecting a critical device 102, in accordance with some embodiments. The layout of FIG. 3A includes the critical device 102 formed in a first portion of semiconductor material 304 (e.g., a first semiconductor region 304) and the dummy device 106 formed in a second portion of semiconductor material 302 (e.g., a second semiconductor region 302). In embodiments, each of the semiconductor regions 302, 304 comprises an active device region including one or more semiconductor structures (e.g., transistor structures, etc.) formed therein. The STI insulator material 110 surrounds the semiconductor regions 302, 304 and provides electrical isolation between the semiconductor structures formed in the respective semiconductor regions 302, 304.

In some circumstances, it may be desirable to minimize an area consumed by the dummy device 106. Thus, the example of FIG. 3A illustrates that the dummy device 106 can be made relatively small, as illustrated by the relatively small semiconductor region 302. As can be seen in the figure, the semiconductor region 302 of the dummy device 106 has an area that is smaller than that of the semiconductor region 304 of the critical device 102. To minimize the size of the dummy device 106, the dummy device 106 need not include a full transistor structure (e.g., full source and drain regions, as are used in a full transistor structure), in examples. Further, to minimize the size of the dummy device 106, the dummy device 106 need not connect to anything (i.e., with the exception of the dummy device's connection to the critical device 102 via conductive layer 106), in examples. Because the purpose of the dummy device 106 is only to protect the critical device 102 from plasma induced damage, the requirements of the dummy device 106 are minimal, and the dummy device 106 can be made relatively small.

As in the example of FIG. 2A, the single gate 108 is shared by the critical device 102 and the dummy device 106, and during processing of the devices 102, 106, a voltage is formed on the gate 108. Because the gate 108 is shared by the critical device 102 and the dummy device 106, a voltage drop over the critical device 102 is the same as that over the dummy device 106. The critical device 102 has the thicker gate dielectric 104, and the dummy device 106 has the thinner gate dielectric 109. Such gate dielectrics 104, 109 are not visible in FIG. 3A but are depicted in FIG. 1, described above. As a result of the difference of the gate dielectric thicknesses, a higher electric field is present in the thinner gate dielectric 109, as compared to that of the thicker gate dielectric 104. When charges accumulate on the gate 108 during processing, carrier tunneling occurs in the dummy device 106 before the critical device 102, due to the higher electric field in the thinner gate dielectric 109. Accordingly, any plasma induced damage occurs in the dummy device 106, and the critical device 102 is protected from such damage.

Figure 3B:
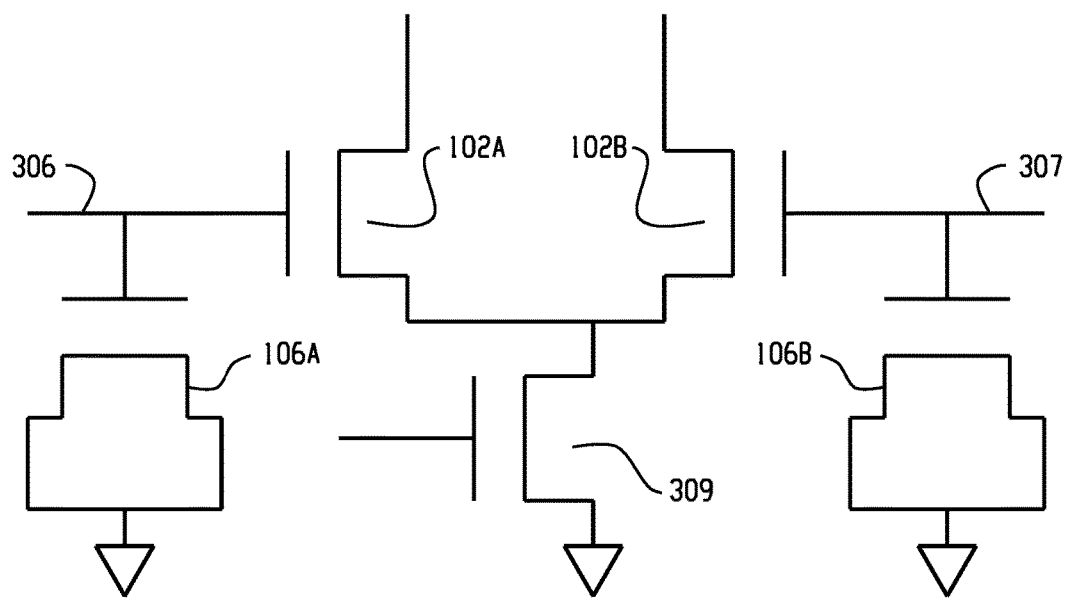
FIG. 3B depicts an example equivalent circuit for the circuit of FIG. 3A, in accordance with some embodiments.

FIG. 3B depicts an example equivalent circuit for the circuit of FIG. 3A, in accordance with some embodiments. As shown in the equivalent circuit, the gate of each critical device 102 is connected to a gate of a dummy device 106 (e.g., via a common gate 108, described above). During processing, charge builds up on a common gate shared by the devices 102A, 106A, such that a same voltage 306 is present at gates of both of the devices 102A, 106A. Likewise, during processing, charge builds up on a common gate shared by the devices 102B, 106B, such that a same voltage 307 is present at gates of both of the devices 102B, 106B.

The equivalent circuit of FIG. 3B further includes a transistor 309 tied to terminals (e.g., source terminals, drain terminals, etc.) of the devices 102A, 102B. In examples, a bias voltage is received at a gate terminal of the transistor 309. In some embodiments, the equivalent circuit of FIG. 3B is a portion of an operational amplifier or comparator, and the transistor 309 is a bias device of the operational amplifier or comparator. In examples, the equivalent circuit of FIG. 3B includes a differential input pair, with a first input being the bias voltage 306, and a second input being the bias voltage 307. It is thus noted that the use of one or more relatively small dummy devices (e.g., as are utilized in the example of FIGS. 3A and 3B) may be suitable for differential input pair configurations and other configurations where a device area must be kept relatively small. Further, in some applications, a circuit design or device design is sensitive to loading on the differential input pair, and the use of a dummy device as described herein can increase a loading on the critical device 102 (e.g., a loading on a gate of the critical device 102). Thus, use of one or more relatively small dummy devices may reduce the loading on the critical device 102, as compared to the loading that would be placed on the critical device 102 by one or more larger dummy devices.

FIGS. 1-3B illustrate embodiments of the instant disclosure utilizing a dummy device with a gate dielectric that is thinner than that of a critical device. In other embodiments, a different technique is used to protect the critical device. For example, as described below with reference to FIGS. 4A and 4B, in embodiments, the dummy device has a shape that is configured to induce a local electric field concentration in the dummy device during processing (e.g., processing that utilizes an RF plasma or another form of ionic radiation, such as RIE etching, etc.). Consequently, during the processing, an electric field in the dummy device is higher than an electric field in the critical device. When charge accumulates on the gate during the processing, carrier tunneling occurs in the dummy device as a result of its higher electric field. Conversely, carrier tunneling does not occur in the critical device, due to its lower electric field.

Figure 4A:
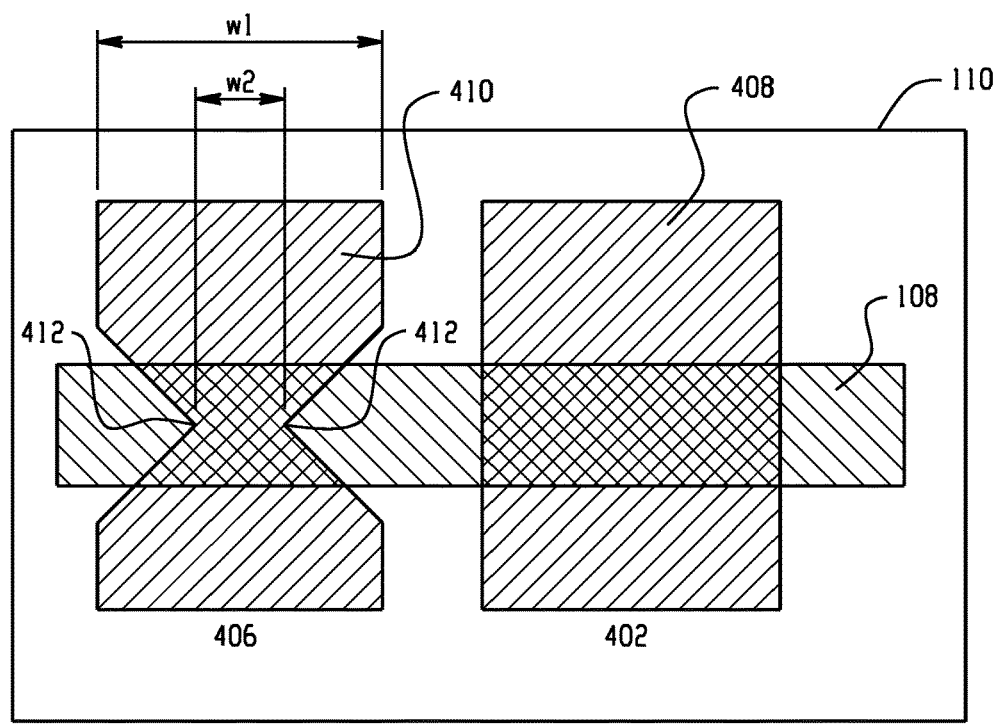
FIGS. 4A and 4B depict use of dummy devices having sharp angles for protecting a critical device, in accordance with some embodiments.
Figure 4B:
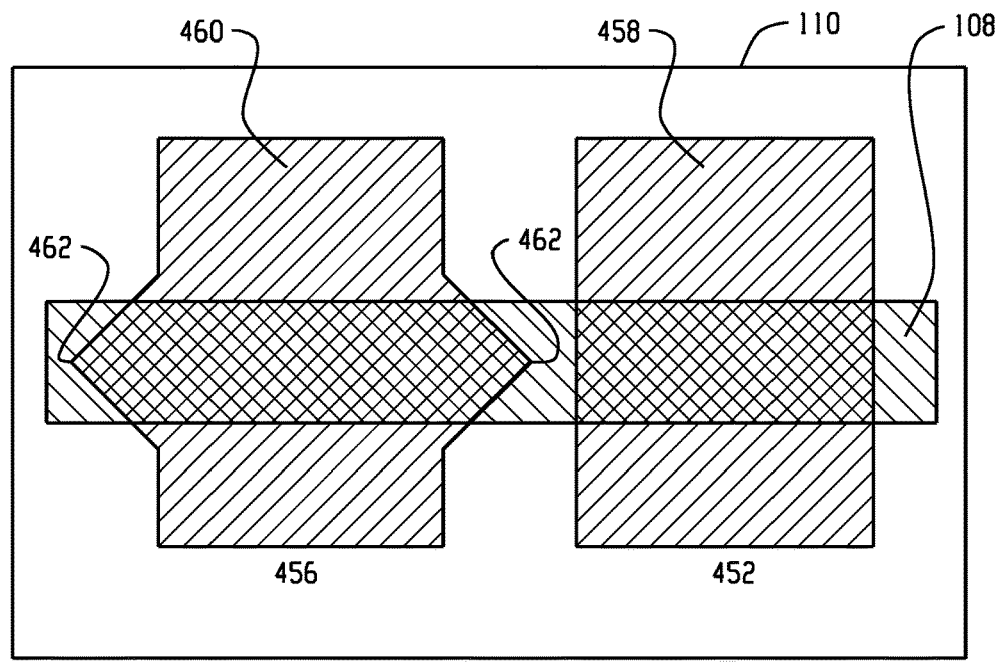

To illustrate such embodiments, reference is made to FIGS. 4A and 4B, which depict use of dummy devices having sharp angles for protecting a critical device, in accordance with some embodiments. The layout of FIG. 4A includes the critical device 402 formed in a first portion of semiconductor material 408 (e.g., a first semiconductor region 408) and the dummy device 406 formed in a second portion of semiconductor material 410 (e.g., a second semiconductor region 410). In embodiments, each of the semiconductor regions 408, 410 comprises an active device region. The semiconductor regions 408, 410 are spatially separated by the STI insulator material 110 that is disposed between the semiconductor regions 408, 410, and the STI insulator material 110 provides electrical isolation between the semiconductor structures formed in the respective semiconductor regions 408, 410. In some embodiments, the STI insulator material 110 surrounds all sides of the semiconductor regions 408, 410, as depicted in FIG. 4A.

The single gate 108 is shared by the critical device 402 and the dummy device 406. In particular, the gate 108 is formed over (i) gate dielectrics of the respective critical and dummy devices 402, 406, and (ii) the STI insulator material 110 (e.g., similar to what is depicted in FIG. 1). The semiconductor region 410 of the dummy device 406 has sharp angles 412 that cause a large, localized electric field in the dummy device 406 under the conductive layer 108 during the processing. The sharp angles 412 each include a point at which two lines meet. The shape of the semiconductor region 410 thus comprises an hourglass shape with (i) top and bottom rectangles having a first width "w1," and (ii) a middle portion between the top and bottom rectangles that tapers to a second width "w2" that is less than the first width w1. It is noted that the shapes of the semiconductor regions 410, 460 of FIGS. 4A and 4B are only examples, and that in other embodiments, different shapes using relatively sharp angles and/or corners are used.

With the large, localized electric field in the dummy device 406 caused by the sharp angles 412, an electric field in the dummy device 406 is higher than an electric field in the critical device 402 during the processing. When charge accumulates on the gate 108 during processing of the devices 402, 406, carrier tunneling occurs in the dummy device 406 as a result of its higher electric field. Conversely, carrier tunneling does not occur in the critical device 402, due to its lower electric field. Accordingly, any plasma induced damage occurs in the dummy device 406, and the critical device 402 is protected from such damage. When the shape of the dummy device's semiconductor region is designed to induce a large, local electric field during processing (as in the examples of FIGS. 4A and 4B), the critical device and the dummy device may have a same gate dielectric thickness or may have different gate dielectric thicknesses.

The layout of FIG. 4B includes the critical device 452 formed in a first portion of semiconductor material 458 (e.g., a first semiconductor region 458) and the dummy device 456 formed in a second portion of semiconductor material 460 (e.g., a second semiconductor region 460). The semiconductor regions 458, 460 are spatially separated by the STI insulator material 110. The single gate 108 is shared by the critical device 452 and the dummy device 456. In particular, the gate 108 is formed over (i) gate dielectrics of the respective critical and dummy devices 452, 456, and (ii) the STI insulator material 110. The semiconductor region 460 of the dummy device 456 has sharp angles 462 that cause a large, localized electric field in the dummy device 456 under the conductive layer 108 during the processing of the devices. The shape of the semiconductor region 460 comprises a rectangle with two triangles protruding from sides of the rectangle. It is noted that this shape is only an example, and that in other embodiments, different shapes using relatively sharp angles and/or corners are used.

With the large, localized electric field in the dummy device 456 caused by the sharp angles 462, an electric field in the dummy device 456 is higher than an electric field in the critical device 452 during the processing. When charge accumulates on the gate 108 during processing of the devices 452, 456, carrier tunneling occurs in the dummy device 456 as a result of its higher electric field. Conversely, carrier tunneling does not occur in the critical device 452, due to its lower electric field. Accordingly, any plasma induced damage occurs in the dummy device 456, and the critical device 452 is protected from such damage.

Although the examples of FIGS. 4A and 4B depict the critical device and the dummy device as having similar sizes (e.g., similar areas), it is noted that in other examples, the dummy device (e.g., dummy device 406, dummy device 456) can be fabricated to have a relatively small size. The formation of dummy devices having relatively small sizes is described above with reference to FIGS. 3A and 3B.

Figure 5:
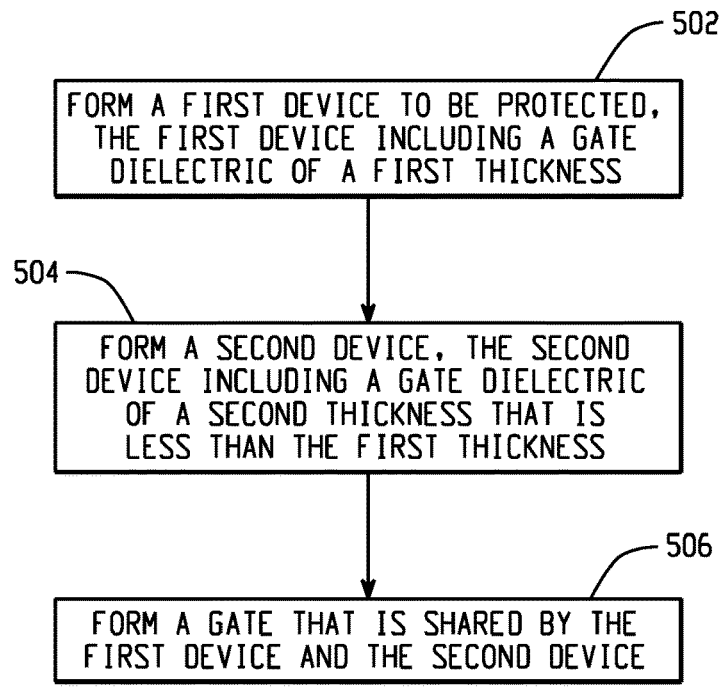
FIG. 5 depicts operations of an example method for protecting a critical device, in accordance with some embodiments.

FIG. 5 depicts operations of an example method for protecting a device. FIG. 5 is described with reference to FIG. 1 above for ease of understanding. But the process of FIG. 5 is applicable to other structures as well. At 502, a first device (e.g., critical device 102) to be protected is formed, the first device including a gate dielectric (e.g., gate dielectric 104) of a first thickness. At 504, a second device (e.g., dummy device 106) is formed, the second device including a gate dielectric (e.g., gate dielectric 109) of a second thickness that is less than the first thickness. At 506, a gate (e.g., gate 108) that is shared by the first device and the second device is formed.

Figure 6:
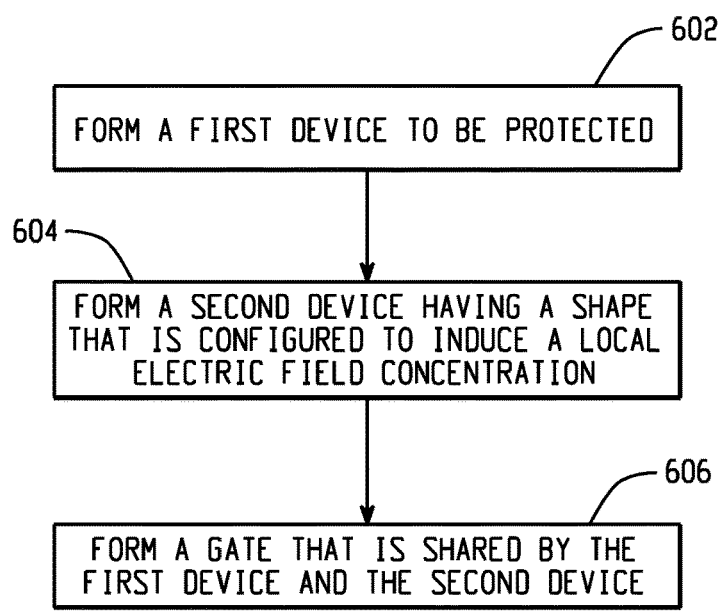
FIG. 6 depicts operations of another example method for protecting a critical device, in accordance with some embodiments.

FIG. 6 depicts operations of another example method for protecting a device. FIG. 6 is described with reference to FIG. 4A above for ease of understanding. But the process of FIG. 6 is applicable to other structures as well. At 602, a first device (e.g., critical device 402) to be protected is formed. At 604, a second device (e.g., dummy device 406) is formed, the second device having a shape that is configured to induce a local electric field concentration in the second device. At 606, a gate (e.g., gate 108) that is shared by the first device and the second device is formed.

The present disclosure is directed to circuits and methods for protecting a device. An example circuit for protecting a device comprises a first device to be protected, the first device including a gate dielectric of a first thickness. The circuit also includes a second device including a gate dielectric of a second thickness that is less than the first thickness. The circuit further includes a gate that is shared by the first device and the second device.

Another example circuit for protecting a device includes a first device to be protected. The circuit also includes a second device having a shape that is configured to induce a local electric field concentration in the second device. The circuit further includes a gate that is shared by the first device and the second device.

In an example method for protecting a device, a first device to be protected is formed, the first device including a gate dielectric of a first thickness. A second device is formed, the second device including a gate dielectric of a second thickness that is less than the first thickness. A gate that is shared by the first device and the second device is formed.

In another example method for protecting a device, a first device to be protected is formed. A second device is formed, the second device having a shape that is configured to induce a local electric field concentration in the second device. A gate that is shared by the first device and the second device is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for protecting a device, the circuit comprising:
a first device to be protected, the first device including a gate dielectric of a first thickness and source, drain, and channel regions of a first transistor;
a second device including a gate dielectric of a second thickness that is less than the first thickness and source, drain, and channel regions of a second transistor; and
a gate electrode that is shared by the first device and the second device and configured to control conductivities of the channel regions of the respective first and second transistors, wherein the gate dielectric of the second device has physical characteristics indicating damage, and the gate dielectric of the first device is protected from the damage.

2. The circuit of claim 1, wherein
the gate dielectrics of the respective first and second devices comprise oxides, and
the gate electrode comprises polysilicon or metal.

3. The circuit of claim 1, wherein the gate electrode is disposed on the gate dielectrics of the respective first and second devices.

4. The circuit of claim 1, wherein the first device and the second device are formed on a common substrate, the circuit further comprising:
an insulator material disposed between the first device and the second device.

5. The circuit of claim 4, wherein the gate electrode is disposed on (i) the gate dielectrics of the respective first and second devices, and (ii) the insulator material.

6. The circuit of claim 1, wherein the second device has an area that is less than that of the first device.

7. The circuit of claim 1, wherein the gate dielectric of the second device is configured to induce a discharge of charges accumulated on the gate electrode through the second device.

8. The circuit of claim 7, wherein the gate dielectric of the second device is configured to induce the discharge of charges during processing of the first device.

9. A method for protecting a device, the method comprising:
   forming a first device to be protected, the first device including a gate dielectric of a first thickness and source, drain, and channel regions of a first transistor;
   forming a second device including a gate dielectric of a second thickness that is less than the first thickness and source, drain, and channel regions of a second transistor;
   forming a gate electrode that is shared by the first device and the second device and configured to control conductivities of the channel regions of the respective first and second transistors; and
   processing the first device and the second device, the second device experiencing damage during the processing, and the first device being protected from the damage.

10. The method of claim 9, wherein
    the gate dielectrics of the respective first and second devices comprise oxides, and
    the gate electrode comprises polysilicon or metal.

11. The method of claim 9, wherein the gate electrode is formed on the gate dielectrics of the respective first and second devices.

12. The method of claim 9, wherein the first device and the second device are formed on a common substrate, the method further comprising:
    forming an insulator material that is disposed between the first device and the second device.

13. The method of claim 12, wherein the gate electrode is formed on (i) the gate dielectrics of the respective first and second devices, and (ii) the insulator material.

14. A circuit for protecting a semiconductor structure, the circuit comprising:
    a first semiconductor structure to be protected, the first semiconductor structure including a gate dielectric of a first thickness and source, drain, and channel regions of a first transistor;
    a second semiconductor structure including a gate dielectric of a second thickness that is less than the first thickness and source, drain, and channel regions of a second transistor; and
    a gate electrode that is shared by the first and second semiconductor structures and configured to control conductivities of the channel regions of the respective first and second transistors, wherein the gate dielectric of the second semiconductor structure has physical characteristics indicating damage, and the gate dielectric of the second semiconductor structure is protected from the damage.

15. The circuit of claim 14, wherein
    the gate dielectrics of the respective first and second semiconductor structures comprise oxides, and
    the gate electrode comprises polysilicon or metal.

16. The circuit of claim 14, wherein the gate electrode is disposed on the gate dielectrics of the respective first and second semiconductor structures.

17. The circuit of claim 14, wherein the first semiconductor structure and the second semiconductor structure are formed on a common substrate, the circuit further comprising:
    an insulator material disposed between the first semiconductor structure and the second semiconductor structure.

18. The circuit of claim 17, wherein the gate electrode is disposed on (i) the gate dielectrics of the respective first and second semiconductor structures, and (ii) the insulator material.

19. The circuit of claim 14, wherein the second semiconductor structure has an area that is less than that of the first semiconductor structure.

20. The circuit of claim 14, wherein the gate dielectric of the second semiconductor structure is configured to induce a discharge of charges accumulated on the gate through the second semiconductor structure.

* * * * *